(12) United States Patent
Carver et al.

(10) Patent No.: US 11,659,685 B2
(45) Date of Patent: May 23, 2023

(54) LIQUID MANIFOLD FOR REPLACING AIR MOVER MODULE IN HYBRID COOLING APPLICATIONS

(71) Applicant: Dell Products L.P., Round Rock, TX (US)

(72) Inventors: Walter R. Carver, Round Rock, TX (US); Douglas S. Haunsperger, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 78 days.

(21) Appl. No.: 17/402,223

(22) Filed: Aug. 13, 2021

(65) Prior Publication Data

US 2023/0049625 A1    Feb. 16, 2023

(51) Int. Cl.
H05K 7/20    (2006.01)

(52) U.S. Cl.
CPC ..... H05K 7/20272 (2013.01); H05K 7/20136 (2013.01)

(58) Field of Classification Search
CPC ... H05K 7/20272; H05K 7/20136; G06F 1/20
See application file for complete search history.

(56) References Cited

U.S. PATENT DOCUMENTS

| | | | |
|---|---|---|---|
| 9,622,379 B1* | 4/2017 | Campbell | H05K 7/20318 |
| 11,465,248 B1* | 10/2022 | Tsai | H01L 23/473 |
| 2012/0035773 A1* | 2/2012 | Stabinski | H05K 7/20836 700/282 |
| 2014/0054025 A1* | 2/2014 | DeCarr | H05K 7/20945 236/94 |
| 2014/0068943 A1* | 3/2014 | Campbell | B21D 53/02 29/890.035 |
| 2014/0202678 A1* | 7/2014 | Goth | H05K 7/20763 165/200 |
| 2017/0045300 A1* | 2/2017 | Boday | H05K 7/20254 |
| 2017/0374767 A1* | 12/2017 | Shelnutt | H05K 7/20781 |
| 2018/0324976 A1* | 11/2018 | Gao | H05K 7/20836 |
| 2022/0206547 A1* | 6/2022 | Heydari | H05K 7/20781 |

* cited by examiner

Primary Examiner — Stephen S Sul
(74) Attorney, Agent, or Firm — Jackson Walker L.L.P.

(57) ABSTRACT

An information handling system may include an information handling resource, at least one fluidic conduit thermally coupled to the information handling resource and configured to convey a cooling liquid proximate to the information handling resource in order to cool the information handling resource, an air mover support infrastructure comprising a plurality of bays, each bay of the plurality of bays configured to receive an air mover for cooling components of the information handling system, and a liquid manifold sized and shaped to be received in at least one of the plurality of bays and received in a first bay of the plurality of bays and configured to enable at least one fluidic conduit to fluidically couple to an external cooling system, wherein the external cooling system is configured to deliver cooled cooling liquid to the information handling system, receive warmed cooling liquid from the information handling system, and cool the warmed cooling liquid.

9 Claims, 4 Drawing Sheets

LIQUID MANIFOLD FOR REPLACING AIR MOVER MODULE IN HYBRID COOLING APPLICATIONS

TECHNICAL FIELD

The present disclosure relates in general to information handling systems, and more particularly to hybrid air-driven and liquid-cooled thermal control systems in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

In low-power configurations, components of an information handling system may be suitably cooled using conventional air-driven cooling. However, in higher-power configurations, some components may require a liquid cooling solution. However, in the case of liquid cooling, other components in the information handling system which are not liquid cooled may still require air-driven cooling. Thus, a hybrid cooling system may include both air-driven cooling and liquid cooling.

It may be desirable to provide flexibility in an information handling system design to accommodate both an air-driven cooling only configuration and a hybrid cooling configuration without a redesign of the information handling system. However, existing approaches do not support information handling systems being capable of both configurations in the same information handling system form factor.

SUMMARY

In accordance with the teachings of the present disclosure, the disadvantages and problems associated with existing designs of thermal control systems for information handling system may be substantially reduced or eliminated.

In accordance with embodiments of the present disclosure, an information handling system may include an information handling resource, at least one fluidic conduit thermally coupled to the information handling resource and configured to convey a cooling liquid proximate to the information handling resource in order to cool the information handling resource, an air mover support infrastructure comprising a plurality of bays, each bay of the plurality of bays configured to receive an air mover for cooling components of the information handling system, and a liquid manifold sized and shaped to be received in at least one of the plurality of bays and received in a first bay of the plurality of bays and configured to enable at least one fluidic conduit to fluidically couple to an external cooling system, wherein the external cooling system is configured to deliver cooled cooling liquid to the information handling system, receive warmed cooling liquid from the information handling system, and cool the warmed cooling liquid.

In accordance with these and other embodiments of the present disclosure, a liquid manifold may include a form factor sized and shaped to be received in a bay of an information handling system for receiving an air mover, and one or more features configured to enable at least one fluidic conduit internal to the information handling system to fluidically couple to an external cooling system, wherein the external cooling system is configured to deliver cooled cooling liquid to the information handling system, receive warmed cooling liquid from the information handling system, and cool the warmed cooling liquid.

In accordance with these and other embodiments of the present disclosure, a method may include inserting a liquid manifold into a bay of an information handling system for receiving an air mover, wherein the liquid manifold is sized and shaped to be received in the bay, and via the liquid manifold, fluidically coupling at least one fluidic conduit internal to an information handling system to an external cooling system, wherein the external cooling system is configured to deliver cooled cooling liquid to the information handling system, receive warmed cooling liquid from the information handling system, and cool the warmed cooling liquid.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
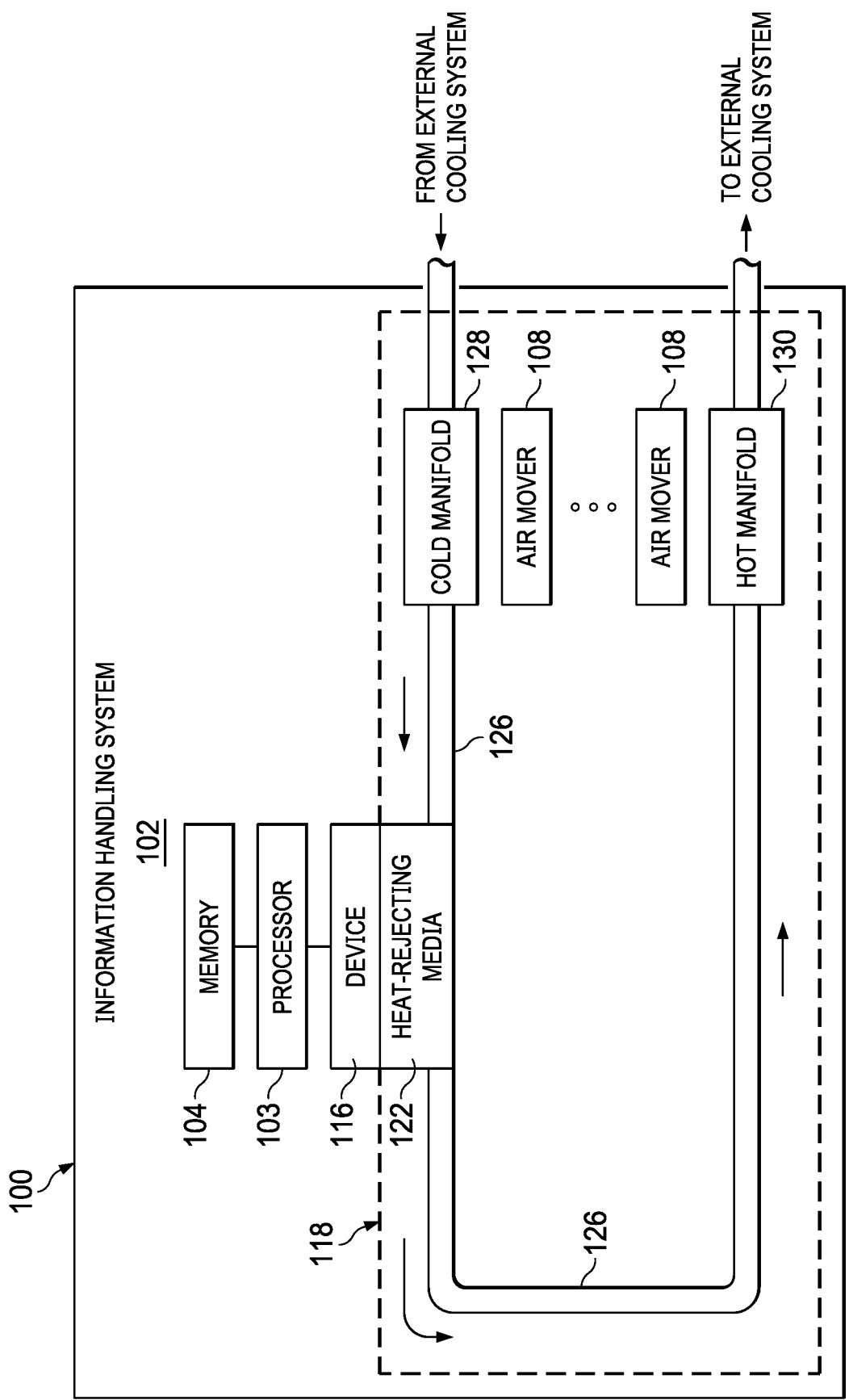
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server or "blade" configured to be housed along with a plurality of other servers or "blades" within a rack, tower, or other enclosure. In other embodiments, information handling system 102 may comprise a personal computer (e.g., a desktop computer, laptop computer, mobile computer, and/or notebook computer). In yet other embodiments, information handling system 102 may be a storage appliance integral to a storage enclosure configured to house a plurality of physical disk drives and/or other computer-readable media for storing data. As shown in FIG. 1, information handling system 102 may include a processor 103, a memory 104, a device 116, and a thermal management system 118.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Device 116 may comprise any component information handling system of information handling system 102, including without limitation processors, buses, memories, I/O devices and/or interfaces, storage resources, network interfaces, motherboards, integrated circuit packages; electro-mechanical devices, displays, and power supplies.

As shown in FIG. 1, thermal management system 118 may include one or more air movers 108, heat-rejecting media 122, fluidic conduits 126, cold manifold 128, and hot manifold 130.

An air mover 108 may include any mechanical or electromechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor. The rotational speed of the motor may be controlled by an air mover control signal communicated from a thermal control system of information handling system 102. In operation, air mover 108 may cool information handling resources of information handling system 102 by drawing cool air into an enclosure 100 housing the information handling resources from outside the chassis, expel warm air from inside the enclosure to the outside of such enclosure, and/or move air across one or more heat sinks (not explicitly shown) internal to the enclosure to cool one or more information handling resources.

Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid thermally coupled to the information handling resource (e.g., heatpipe, heat spreader, heatsink, finstack, etc.) such that heat generated by the information handling resource is transferred from the information handling resource.

In operation, a cooled fluid may be received by cold manifold 128 from an external cooling system or other source of cooled fluid. The external cooling system may include components for cooling the fluid (e.g., a radiator) and components for driving flow of the fluid (e.g., a pump). Thus, the cooled fluid may be driven from cold manifold 128 to a fluidic conduit 126. As the fluid passes by heat-rejecting media 122 in a fluidic conduit 126 proximate to device 116, heat may be transferred from device 116 to heat-rejecting media 122 and from heat-rejecting media 122 to the fluid in fluidic conduit 126, thus cooling device 116. Such heated fluid may then be discharged from a fluidic conduit to hot manifold 130, from where such fluid may return to the cooling system that cools such fluid before the fluid again returns to information handling system 102 via cold manifold 128.

As described in greater detail below, each of cold manifold 128 and hot manifold 130 may be sized and shaped in a manner sufficiently similar to an air mover 108, such that each of cold manifold 128 and hot manifold 130 may replace a respective corresponding air mover 108 within an air mover support infrastructure, allowing conversion of information handling system 102 from a strictly air-based cooling system to a hybrid cooling system and vice versa, while requiring no modification of the air mover support infrastructure.

In addition to processor 103, memory 104, device 116, and thermal management system 118, information handling system 102 may include one or more other information handling resources. In addition, for the sake of clarity and exposition of the present disclosure, FIG. 1 depicts only one device 116. In embodiments of the present disclosure, information handling system 102 may include any number of devices 116. Furthermore, for the sake of clarity and exposition of the present disclosure, FIG. 1 depicts device 116 including a thermal management system 118 for cooling of device 116. However, in some embodiments, approaches similar or identical to those used to cool device 116 as described herein may be employed to provide cooling of processor 103, memory 104, and/or any other information handling resource of information handling system 102.

Figure 2:
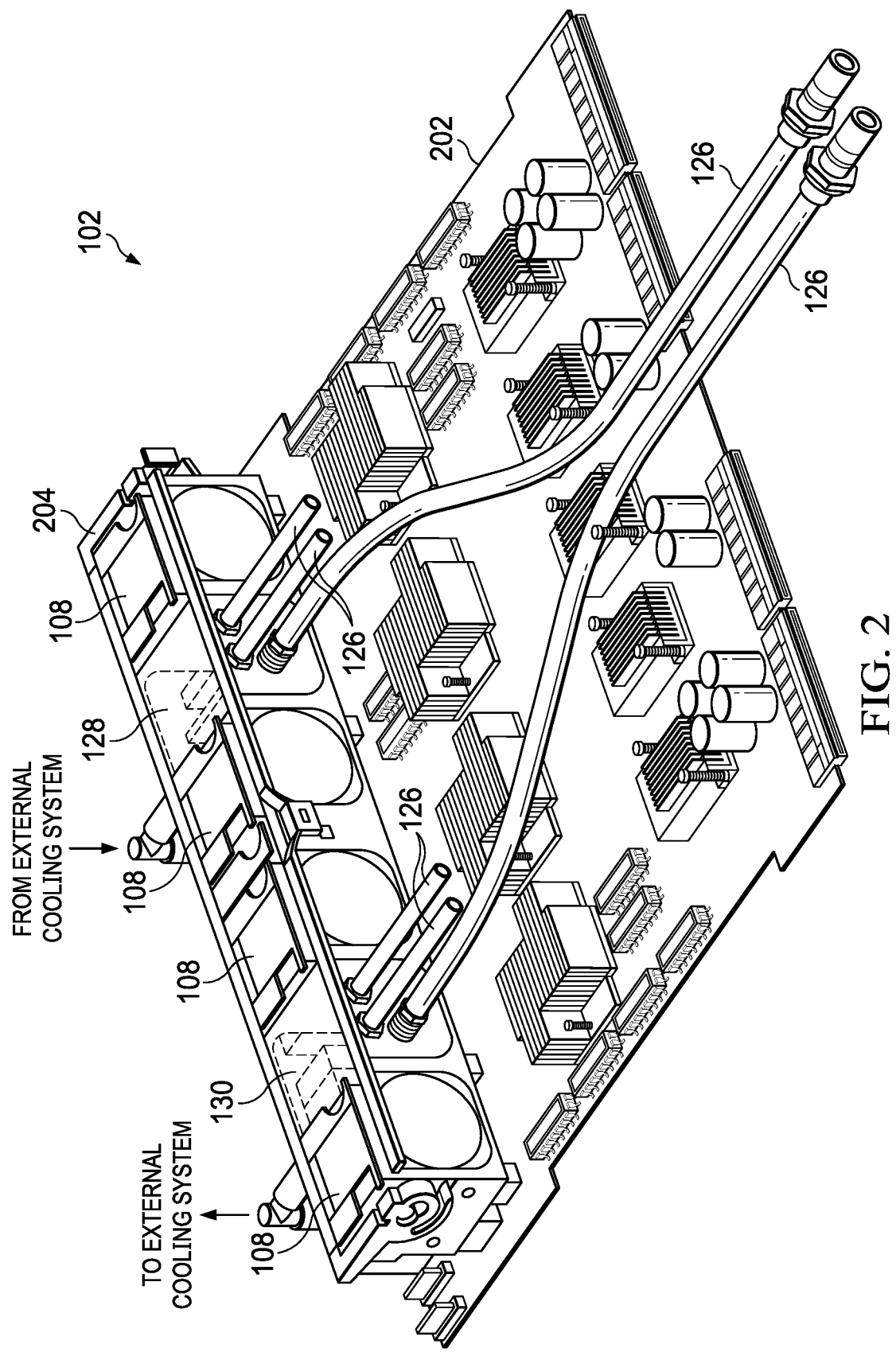
FIG. 2 illustrates an isometric perspective view of selected components of an information handling system, in accordance with embodiments of the present disclosure.
Figure 3:
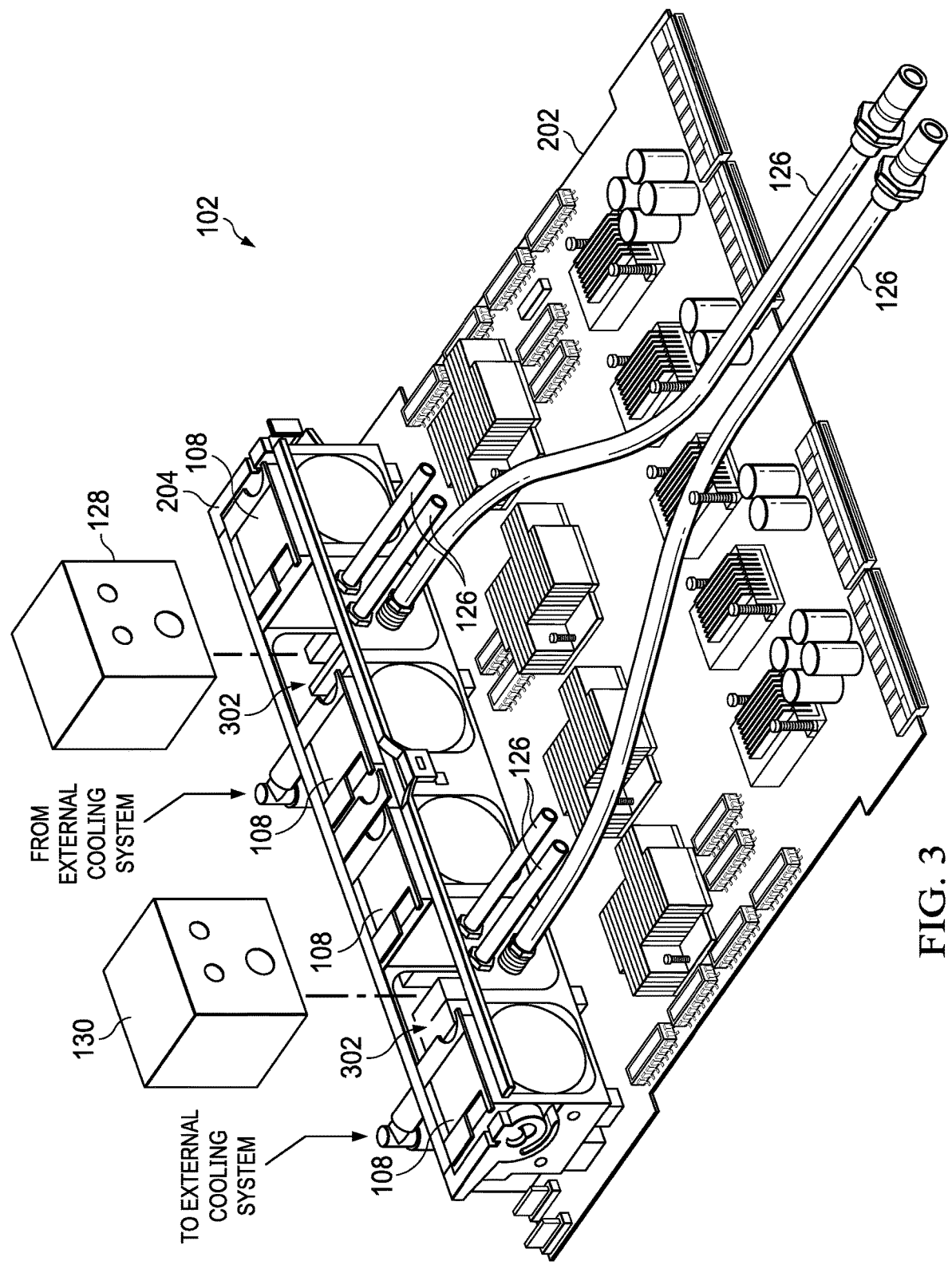
FIG. 3 illustrates another isometric perspective view of selected components of an information handling system with cold manifold and hot manifold removed, in accordance with embodiments of the present disclosure.
Figure 4:
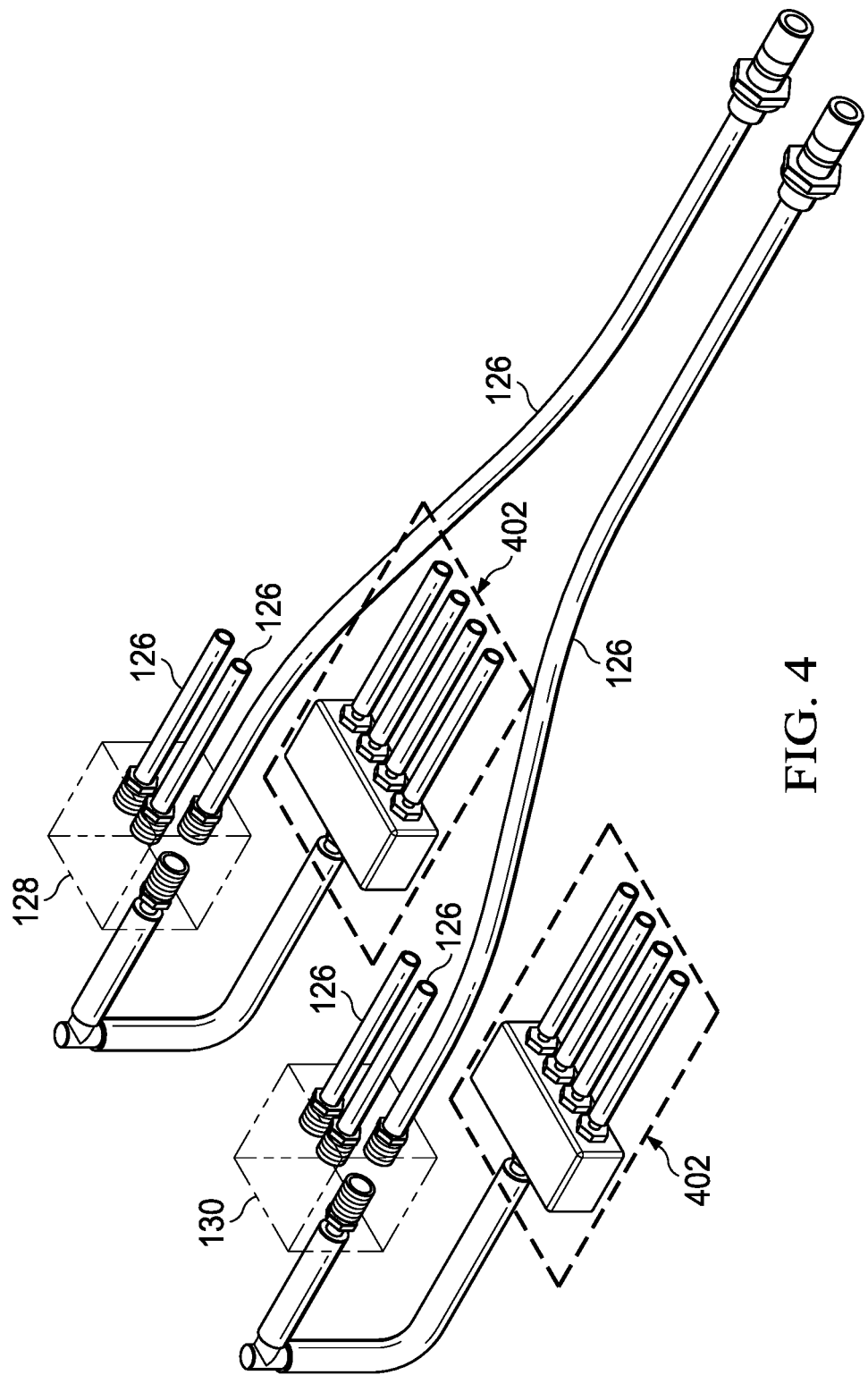
FIG. 4 illustrates selected components of a thermal management system removed from an information handling system, in accordance with embodiments of the present disclosure.

FIG. 2 illustrates an isometric perspective view of selected components of information handling system 102, in accordance with embodiments of the present disclosure. FIG. 3 illustrates another isometric perspective view of selected components of information handling system 102 with cold manifold 128 and hot manifold 130 removed, in accordance with embodiments of the present disclosure. FIG. 4 illustrates selected components of a thermal management system, in particular cold manifold 128, hot manifold 130, and fluidic conduits 126, removed from information handling system 102, in accordance with embodiments of the present disclosure.

As shown in FIGS. 2 and 3, one or more air movers 108 may be housed in or otherwise received by a respective bay 302 of air mover support infrastructure 204. Air mover support infrastructure 204 may comprise any mechanical structure mechanically affixed to a printed circuit board 202, chassis, and/or other corresponding mechanical structure(s) of information handling system 102, and may include one or more bays 302 each sized and shaped to receive an air mover 108, thus defining a fixed location and position of air movers 108 relative to other components of information handling system 102.

As shown in FIGS. 2-4, cold manifold 128 and hot manifold 130 may each be fluidically coupled to respective fluidic conduits 126, via one or more suitable fluid fittings. In some embodiments, such fluid fittings may be quick-disconnect fluid fittings to allow for selective connection to and disconnection from cold manifold 128 and hot manifold 130 by fluidic conduits 126.

As shown in FIGS. 2-4, each of cold manifold 128 and hot manifold 130 may be sized and shaped to be received into bays 302 of air mover support infrastructure 204, such that air mover support infrastructure 204 may provide mechanical structure for positioning and locating cold manifold 128 and hot manifold 130 relative to other components of information handling system 102. Further, each of cold manifold 128 and hot manifold 130 may be sized and shaped to create an air seal to prevent or minimize air flow through the bays 302 in which cold manifold 128 and hot manifold 130 are received, in order to prevent air bypass or air recirculation through such bays 302.

In some embodiments, each of cold manifold 128 and hot manifold 130 may comprise an enclosure configured to hold cooling fluid, with openings for fluidically coupling to fluidic conduits 126 and coupling to the external cooling system. In other embodiments, each of cold manifold 128 and hot manifold 130 may comprise a strictly mechanical structure, which may serve as a mechanical structure with openings through which fluidic conduits 126 may pass from the exterior to the interior of information handling system 102. In any event, each of cold manifold 128 and hot manifold 130 may include one or more paths for cooling fluid to pass through air mover support infrastructure 204.

As shown in FIG. 4, thermal management system 118 may include secondary components 402 (e.g., other fluidic conduits and/or manifolds) which may receive cooling fluid from or deliver cooling fluid to the external cooling system.

Using the systems and methods described above, some air movers 108 may be replaced with liquid manifolds (e.g., cold manifold 128, hot manifold 130), leaving some air movers 108 in place for air-driven cooling in addition to liquid cooling. Further, an existing air mover support infrastructure 204 may be used to mount the liquid manifolds in place of air movers 108 within bays 302 of air mover support infrastructure 204. In addition, each of cold manifold 128 and hot manifold 130 may be sized and shaped to create an air seal to prevent or minimize air flow through the bays 302 in which cold manifold 128 and hot manifold 130 are received, in order to prevent air bypass or air recirculation through such bays 302.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   an information handling resource;
   at least one fluidic conduit thermally coupled to the information handling resource and configured to convey a cooling liquid proximate to the information handling resource in order to cool the information handling resource;
   an air mover support infrastructure comprising a plurality of bays, each bay of the plurality of bays configured to receive an air mover for cooling components of the information handling system; and
   a liquid manifold sized and shaped to be received in at least one of the plurality of bays and received in a first bay of the plurality of bays, sized and shaped to create an air seal to minimize air flow through the first bay when received in the first bay, and configured to enable at least one fluidic conduit of the at least one fluidic conduit to fluidically couple to an external cooling system, wherein the external cooling system is configured to deliver cooled cooling liquid to the information handling system, receive warmed cooling liquid from the information handling system, and cool the warmed cooling liquid.

2. The information handling system of claim 1, wherein the liquid manifold comprises:
   an enclosure configured to hold the cooling fluid; and
   a plurality of openings for fluidically coupling the enclosure to the at least one fluidic conduit and the external cooling system.

3. The information handling system of claim 1, wherein the liquid manifold comprises a mechanical structure, which may serve as a mechanical structure with openings through which the at least one fluidic conduit passes from an exterior to an interior of the information handling system.

4. A liquid manifold comprising:
   a form factor sized and shaped to be received in a bay of an information handling system for receiving an air mover and sized and shaped to create an air seal to minimize air flow through the bay when received in the bay; and
   one or more features configured to enable at least one fluidic conduit internal to the information handling system to fluidically couple to an external cooling system, wherein the external cooling system is configured to deliver cooled cooling liquid to the information handling system, receive warmed cooling liquid from the information handling system, and cool the warmed cooling liquid.

5. The liquid manifold of claim 4, wherein the liquid manifold further comprises an enclosure configured to hold cooling fluid; and
   wherein the one or more features comprise a plurality of openings for fluidically coupling the enclosure to the at least one fluidic conduit and the external cooling system.

6. The liquid manifold of claim 4, wherein the liquid manifold further comprises a mechanical structure with openings through which the at least one fluidic conduit passes from an exterior to an interior of the information handling system.

7. A method comprising:
   inserting a liquid manifold into a bay of an information handling system configured for receiving an air mover, wherein the liquid manifold is sized and shaped to be received in the bay;
   inserting the liquid manifold such that the liquid manifold creates an air seal to minimize air flow through the bay when received in the bay; and
   via the liquid manifold, fluidically coupling at least one fluidic conduit internal to the information handling system to an external cooling system, wherein the external cooling system is configured to deliver cooled cooling liquid to the information handling system, receive warmed cooling liquid from the information handling system, and cool the warmed cooling liquid.

8. The method of claim 7, wherein the liquid manifold further comprises:
   an enclosure configured to hold the cooling fluid; and
   a plurality of openings for fluidically coupling the enclosure to the at least one fluidic conduit and the external cooling system.

9. The method of claim 7, wherein the liquid manifold further comprises a mechanical structure with openings through which the at least one fluidic conduit passes from an exterior to an interior of the information handling system.

* * * * *